United States Patent
Chen et al.

(10) Patent No.: US 8,268,542 B2
(45) Date of Patent: Sep. 18, 2012

(54) METHOD FOR REDUCING SIDE LOBE PRINTING USING A BARRIER LAYER

(75) Inventors: Kuang-Jung Chen, Poughkeepsie, NY (US); Wu-Song Huang, Brewster, NY (US); Wai-kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 569 days.

(21) Appl. No.: 11/949,190

(22) Filed: Dec. 3, 2007

(65) Prior Publication Data

US 2009/0142704 A1    Jun. 4, 2009

(51) Int. Cl.
*G03F 7/26* (2006.01)
(52) U.S. Cl. .................................. 430/322; 430/394
(58) Field of Classification Search .................. 430/322, 430/394
See application file for complete search history.

(56) References Cited

U.S. PATENT DOCUMENTS

| | | | |
|---|---|---|---|
| 5,700,606 A | 12/1997 | Kobayashi et al. | |
| 6,077,633 A | 6/2000 | Lin et al. | |
| 6,214,497 B1 | 4/2001 | Stanton | |
| 6,245,492 B1 * | 6/2001 | Huang et al. | 430/326 |
| 6,465,160 B1 | 10/2002 | Wang et al. | |
| 6,841,310 B2 | 1/2005 | Dulman | |
| 2004/0043328 A1 * | 3/2004 | Lu | 430/311 |
| 2004/0069745 A1 * | 4/2004 | Ho et al. | 216/41 |
| 2004/0197676 A1 * | 10/2004 | Rau | 430/5 |
| 2006/0216649 A1 * | 9/2006 | Paxton et al. | 430/311 |
| 2008/0076060 A1 * | 3/2008 | Fedynyshyn | 430/270.1 |

* cited by examiner

*Primary Examiner* — Brittany Raymond
(74) *Attorney, Agent, or Firm* — Wenjie Li

(57) ABSTRACT

A method suitable for reducing side lobe printing in a photolithography process is enabled by the use of a barrier layer on top of a photoresist on a substrate. The barrier layer is absorbing at the imaging wavelength of the underlying photoresist and thus blocks the light from reaching the photoresist. A first exposure followed by a development in an aqueous base solution selectively removes a portion of the barrier layer to reveal a section of the underlying photoresist layer. At least a portion of the revealed section of the photoresist layer is then exposed and developed to form a patterned structure in the photoresist layer. The barrier layer can also be bleachable upon exposure and bake in the present invention.

10 Claims, 2 Drawing Sheets

METHOD FOR REDUCING SIDE LOBE PRINTING USING A BARRIER LAYER

FIELD OF THE INVENTION

This invention relates to a photolithography process for semiconductor fabrication. More particularly, this invention is directed to a method of using a barrier layer to reduce side lobe printing in a photolithography process.

BACKGROUND OF THE INVENTION

Photolithography is commonly used to make miniaturized electronic components such as integrated circuits in semiconductor manufacturing. In a photolithography process, a layer of photoresist is deposited on a substrate, such as a silicon wafer. The substrate is baked to remove any solvent remained in the photoresist layer. The photoresist is then selectively exposed through a photomask with a desired pattern to a source of actinic radiation. The radiation exposure causes a chemical reaction in the exposed areas of the photoresist and creates a latent image corresponding to the mask pattern in the photoresist layer. The photoresist is next developed in a developer solution to remove either the exposed portions of the photoresist for a positive photoresist or the unexposed portions of the photoresist for a negative photoresist. The patterned photoresist can then be used as a mask for subsequent fabrication processes on the substrate, such as deposition, etching, or ion implantation processes.

Advances in semiconductor device performance have typically been accomplished through a decrease in semiconductor device dimensions. The demand for ever smaller semiconductor device calls for higher exposure resolution and better depth of images in photolithography processes. Attenuated phase shift masks (PSMs) have been used to overcome the diffraction effects associated with conventional binary masks and to improve the exposure resolution and depth of images projected on a substrate. An attenuated PSM usually contains trasparent regions and partially transmissive regions. The partially transmissive regions provide a 180° phase shift and partial transmission, usually between about 3% and 10%, of the light they receive. The light passing through the partially transmissive regions (background light) destructivelly interferes with some of the light diffracted from the transparent regions of the attenuated PSM, thus reducing the detrimemtal effects caused by the diffracted light.

Using attenuated PSMs, on the other hand, may cause side lobe printing around the main patterns due to the non zero light transmission of the attenuated phase shift material, particularly in forming contact hole patterns. In side lobe printing, the background light and the diffraction light superimpose in the spaces between wanted features. In certain areas, the intensity of the superimposed lights is strong enough to cause a chemical reaction in the photoresist layer. The photoresist layer in these areas is then developed during the developing step, forming unwanted patterns (known in the art as side lobes) in the photoresist. The side lobes may be transferred to the substrate during subsequent fabrication processes and thus corrupt the desired features of the devices. The side lobe printing becomes more pronounced as the feature size becomes smaller and the spaces between the desired features decreases.

To prevent the problem of side lobe printing, prior art processes typically use masks with special built-in anti side lobe structures (see, for example, U.S. Pat. Nos. 5,700,606, 6,077,633 and 6,214,497). These processes are usually complicated and expensive. U.S. Pat. No. 6,465,160 discloses a method to mitigate side lobe printing by adjusting post-exposure baking time and temperature and soft-baking time and temperature to increase the contrast of the photoresist pattern and suppress the generation of side lobes. This method, however, may not be very effective.

Thus, there remains a need for an effective and convenient process to reduce side lobe printing in semiconductor device fabrication.

SUMMARY OF THE INVENTION

The present invention provides an effective and convenient method to reduce side lobe printing in a photolithography process. The method of the invention is generally characterized by the presence of a barrier layer applied on top of a photoresist layer.

In one aspect, the present invention describes a method for forming a relief image on a substrate. The method includes the following steps:

(A) providing a coating of a photoresist layer over said substrate;

(B) providing a coating of a barrier layer over said photoresist layer;

(C) exposing said substrate to a first radiation through a first patterned mask to form a first latent image in said barrier layer;

(D) contacting the substrate with a first aqueous base solution, whereby a portion of the barrier layer is selectively dissolved to form a revealed section of said photoresist layer;

(E) exposing at least a portion of said revealed section of said photoresist layer to a second radiation having an imaging wavelength same as said first radiation through a second patterned mask to form a second latent image in said photoresist layer, wherein said second patterned mask comprises a pattern prone to form side lobes in said photoresist layer; and (F) contacting said substrate with a second aqueous base solution, whereby a portion of said photoresist layer is selectively dissolved to form a patterned structure in said photoresist layer.

The barrier layer has an absorption parameter (k) greater than the k parameter of the underlying photoresist at the imaging wavelength of the second radiation. The barrier layer preferably has a k parameter in the range from about 0.05 to about 0.8 at the imaging wavelength of the second radiation. The barrier layer contains a resist polymer with an absorbing aromatic moiety. The barrier layer has a thickness less than the thickness of the underlying photoresist layer.

The first patterned mask and the second patterned mask may be the same mask. The pattern prone to form side lobes in the photoresist layer includes a contact hole pattern. The imaging wavelength of the second radiation is preferably about 193 nm. The first and second aqueous base solutions include a tetramethylammonium hydroxide (TMAH) solution. The substrate is baked between steps (C) and (D). The method further includes etching or ion implanting portions of the substrate not covered by the photoresist layer after step (F), thereby transferring said patterned structure into the substrate.

In another aspect, the present invention provides a method for forming a relief image on a substrate. The method includes the following steps:

(A) providing a coating of a photoresist layer over said substrate;

(B) providing a coating of a barrier layer over said photoresist layer;

(C) exposing said substrate to a first radiation through a first patterned mask to form a bleached portion in said barrier layer, wherein said bleached portion of said barrier layer has substantially lower absorption than an unbleached portion of said barrier layer at an first imaging wavelength of said first radiation;

(D) exposing at least a portion of said bleached portion of said barrier layer and said photoresist layer to a second radiation having an second imaging wavelength same as said first radiation through a second patterned mask to form a latent image, wherein said second patterned mask comprises a pattern prone to form side lobes in said photoresist layer; and (E) contacting said substrate with an aqueous base solution, whereby said barrier layer and a portion of said photoresist are selectively dissolved to form a patterned structure in said photoresist layer.

The barrier layer has an absorption parameter (k) greater than the k parameter of the underlying photoresist at the imaging wavelength of the first radiation. The barrier layer preferably has k parameter in the range from about 0.05 to about 0.8 at the imaging wavelength of the first radiation. The barrier layer also has a thickness less than the thickness of the underlying photoresist.

The substrate is further baked after exposure in step (C). The first patterned mask and the second patterned mask are the same mask. The pattern prone to form side lobes in the photoresist includes a contact hole pattern. The imaging wavelength of the first radiation is preferably about 193 nm. The absorption parameter (k) of the bleached portion of the barrier layer is more than 20% lower than the k parameter of the unbleached portion of the barrier layer at the wavelength of the first radiation. The first and second aqueous base solutions include a tetramethylammonium hydroxide (TMAH) solution. The method further includes etching or ion implanting portions of the substrate not covered by the photoresist layer after step (E), thereby transferring the patterned structure into the substrate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF PREFERRED EMBODIMENTS

Figure 1A:
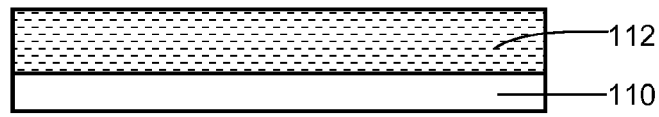
FIGS. 1a-1f are cross-sectional views showing processing steps for reducing side lobe printing using a barrier layer in accordance with one embodiment of the present invention.

In describing the preferred embodiments of the present invention, reference will be made herein to FIGS. 1a-1f and FIGS. 2a-2e of the drawings in which like numerals refer to like features of the invention. Features of the invention are not necessarily shown to scale in the drawings.

The present invention provides a method of reducing side lobe printing using a barrier layer which is coated above a photoresist layer. The barrier layer is absorbing at imaging wavelength of the underlying photoresist and thus blocks lights associated with side lobe printing from reaching the underlying photoresist. It is preferred that the barrier layer has an absorption parameter (k) greater than that of the underlying photoresist layer at the imaging wavelength of the underlying photoresist. The absorption parameter k indicates the amount of absorption loss when an electromagnetic wave propagates through a material, such as a photoresist. The k parameter of the barrier layer is preferably in the range from about 0.05 to about 0.8, more preferably in the range from about 0.08 to about 0.5 at the imaging wavelength of the underlying photoresist.

In one embodiment, the barrier layer employed in the present invention includes a composition referred to as a "grey resist". The grey resist includes a resist polymer with an absorbing moiety. The absorbing moiety of the resist polymer of the grey resist may be any chemical moieties that absorb radiation at the exposure wavelength. Preferably, the absorbing moiety includes, but is not limited to, unsubstituted and substituted aromatic moieties such as benzene, naphthalene, hydroxy-substituted benzene, and hydroxy-substituted naphthalene. Examples of the resist polymer of the grey resist include polymers containing polycyclic moieties commonly used in 193 nm photoresists and phenol groups commonly used in 248 nm photoresists. The grey resist is photoimageable with the same wavelength of light as the underlying photoresist, and is also developable with an aqueous base developing solution typically used to develop the photoresist. In addition to the resist polymer, the grey resist further comprises a photoacid generator and a solvent. Preferably, the grey resist also contains a quencher.

Figure 1B:
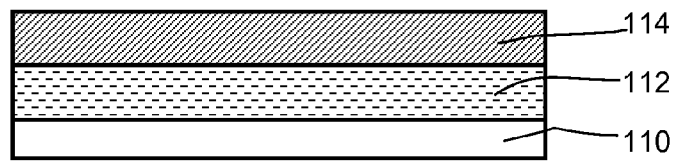
Figure 1C:
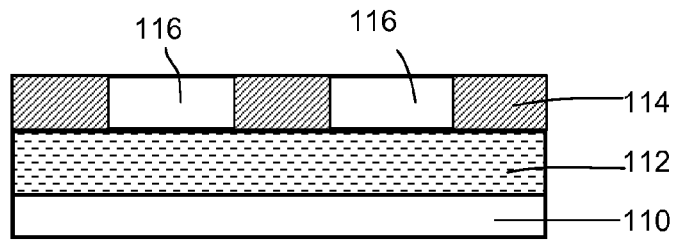

Referring to FIGS. 1a-1f, a photoresist is first applied to substrate 110 to provide the photoresist coating layer 112 (FIG. 1a). A barrier layer 114 is then applied over the photoresist layer 112 (FIG. 1b). Barrier layer 114 is preferably a grey resist. In FIG. 1c, the substrate is exposed to a first radiation through a first patterned mask to form a latent image 116 in the barrier layer 114. A post exposure bake (PEB) step may be performed after the substrate is exposed with the first radiation. The preferred range of the PEB temperature is from about 70° C. to about 120° C., more preferably from about 90° C. to about 110° C. In some instances, it is possible to avoid the PEB step since for certain chemistries, such as acetal and ketal chemistries, deprotection of the resist polymer proceeds at room temperature.

Figure 1D:
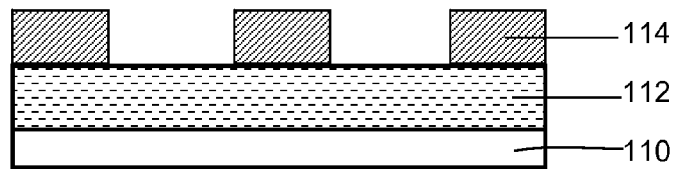

The substrate is next brought into contact with a first aqueous base solution to selectively dissolve a portion of the barrier layer and to reveal a section of the underlying photoresist layer (FIG. 1d). The grey resist contained in the barrier layer can be either a positive-tone resist or a negative-tone resist. When the grey resist is a positive-tone resist, the exposed portion of the barrier layer is dissolved in the first aqueous base solution. When the grey resist is a negative-tone resist, the unexposed portion of the barrier layer is dissolved in the first aqueous base solution.

Figure 1E:
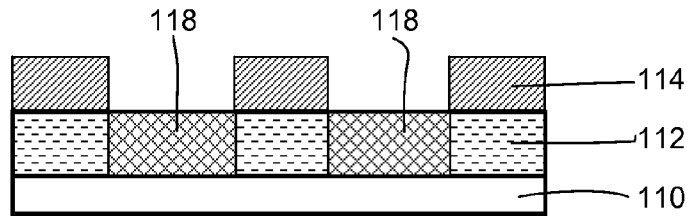
Figure 1F:
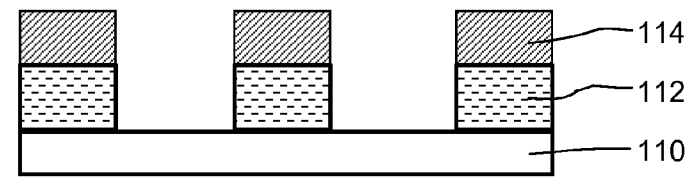

In FIG. 1e, at least a portion of the revealed section of the underlying photoresist layer is exposed to a second radiation having an imaging wavelength same as the first radiation through a second patterned mask to form a latent image 118. The substrate is then contacted with a second aqueous base solution to remove a portion of the photoresist layer to form a patterned structure in the photoresist layer (FIG. 1f).

In another embodiment, the barrier layer employed in the present invention comprises a composition referred to as a "bleachable barrier layer". The bleachable barrier layer comprises a polymer with an absorbing moiety which is cleavable upon exposure at the imaging wavelength of the underlying photoresist layer, thereby significantly reduces the absorption of the bleachable barrier layer at the exposure wavelength. A post exposure bake (PEB) may be needed to cleave the absorbing moiety from the polymer. The absorbing moiety of the resist polymer of the bleachable barrier layer may be any chemical moieties that absorb radiation at the exposure wavelength. Preferably, the absorbing moiety includes, but is not limited to, unsubstituted and substituted aromatic moieties such as benzene, naphthalene, hydroxy-substituted benzene, and hydroxy-substituted naphthalene.

The polymer of the bleachable barrier layer preferably contains an acidic structure render the polymer soluble in an aqueous base solution. The acidic structure of the polymer includes, but is not limited to hexafluoroalcohol, phenol, fluorosulfonamide and carboxylic acid. In addition to the polymer, the bleachable barrier layer further comprises a photoacid generator and a solvent. Preferably, the bleachable barrier layer also contains a quencher.

Figure 2A:
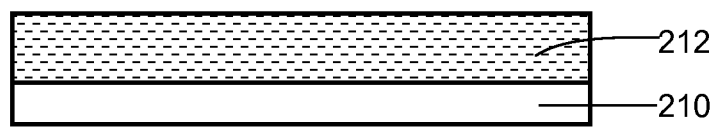
FIGS. 2a-2e are cross-sectional views showing processing steps for reducing side lobe printing using a barrier layer in accordance with another embodiment of the present invention.
Figure 2B:
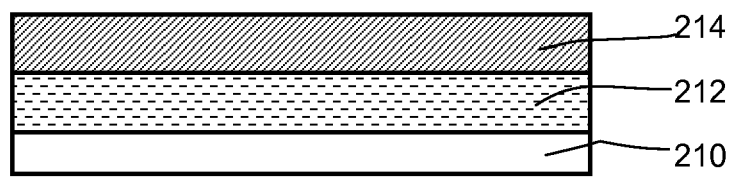
Figure 2C:
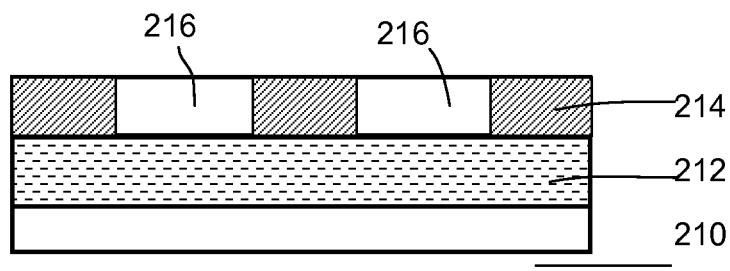

Now referring to FIGS. 2a-2e, a photoresist is first applied to substrate 210 to provide the photoresist coating layer 212 (FIG. 2a). A barrier layer 214 is then applied over the photoresist layer 212 (FIG. 2b). In FIG. 2c, the substrate is exposed to a first radiation through a first patterned mask to form a bleached portion 216 in the barrier layer. In some cases, it is possible that a PEB step is required in order to form the bleached portion in the barrier layer. In the case that a PEB step is needed, the preferred range of the PEB temperature is from about 70° C. to about 120° C., more preferably from about 90° C. to about 110° C. The bleached portion 216 has significantly lower absorption than an unbleached portion of the barrier layer at the wavelength of the first radiation. Preferably, the absorption parameter (k) of the bleached portion of the barrier layer at the wavelength of the first radiation is more than 20% lower than that of the unbleached portion of the barrier layer. More preferably, the k parameter of the bleached portion of the barrier layer at the wavelength of the first radiation is more than 40% lower than that of the unbleached portion of the barrier layer.

Figure 2D:
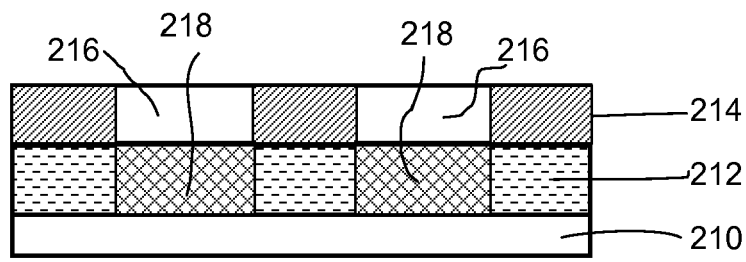
Figure 2E:
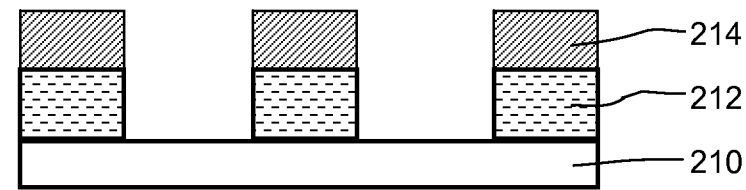

In FIG. 2d, at least a portion of the bleached portion of the barrier layer and the underlying photoresist layer are exposed to a second radiation having the same imaging wavelength as the first radiation through a second patterned mask to form a latent image 218 in the photoresist layer. The substrate is then contacted with a second aqueous base solution to remove the barrier layer and a portion of the underlying photoresist layer to form a patterned structure in the photoresist layer (FIG. 2e).

The substrate in the present invention is suitably any substrate conventionally used in processes involving photoresists. For example, the substrate can be silicon, silicon oxide, aluminum-aluminum oxide, gallium arsenide, ceramic, quartz, copper or any combination thereof including multilayers. The substrate may further contain an antireflective layer commonly used in conjunction with photoresists. The photoresist layer in the previous embodiments may be formed from any photoresist conventionally used in semiconductor industry, including 193 nm and 248 nm photoresists. Both positive-tone resists and negative-tone resists are suitable to be used in the present invention. The photoresist may be applied by virtually any standard means including spin coating. The substrate with the photoresist layer may be baked (post applying bake (PAB)) to remove any solvent from the photoresist and improve the coherence of the photoresist layer. The preferred range of the PAB temperature for the photoresist layer is from about 70° C. to about 150° C., more preferably from about 90° C. to about 130° C. The preferred range of thickness of the photoresist layer is from about 20 nm to about 400 nm, more preferably from about 50 nm to about 300 nm.

The solvent for the barrier layer in the present invention is chosen such that it does not dissolve the underlying photoresist layer. The barrier layer may be applied by virtually any standard means including spin coating. A PAB may be applied to remove any solvent from the barrier layer and improve the coherence of the barrier layer. The preferred range of the PAB temperature for the barrier layer is from about 70° C. to about 130° C., more preferably from about 90° C. to about 110° C. It is preferred that the barrier layer has a thickness less than the thickness of the underlying photoresist. The preferred range of thickness of the barrier layer is from about 10 nm to about 200 nm, more preferably from about 40 nm to about 90 nm.

The patterned masks employed in the present invention can be any photomasks commonly used in photolithographic processes including attenuated PSMs. It is preferred that the second mask used for exposing the photoresist layer a pattern prone to form side lobes in the photoresist. One way to determine if a pattern is prone to form side lobes in the photoresist is to expose the photoresist without the barrier layer through a mask containing such a pattern. If side lobes form in the photoresist layer, the pattern is then prone to form side lobes in the photoresist layer. It is further preferred that the pattern on the second mask comprises contact hole patterns. The first patterned mask used for exposing the barrier layer and the second patterned mask used for exposing the photoresist layer can be either the same mask or different masks. In the case that they are different, the first patterned mask is designed such that the barrier layer at positions where side lobe printing is supposed to occur remain undissolved when the substrate is contacted with the first aqueous base solution. The positions where side lobe printing is supposed to occur can be calculated from the pattern size, pattern pitch and exposure conditions or determined by actual exposure.

The radiations employed in the present invention can be visible light, ultraviolet (UV), extreme ultraviolet (EUV) and electron beam (E-beam). It is preferred that the imaging wavelength of the first and second radiations employed in the previous embodiments is about 193 nm. It is further preferred that the dosage used in the first radiation is lower than the dosage used in the second radiation.

It is preferred that the first and second aqueous base solutions are tetramethylammonium hydroxide (TMAH) solutions. It is further preferred that the concentration of the TMAH solutions is about 0.263 N. The aqueous base solutions may further comprise additives, such as surfactants, polymers, isopropanol, ethanol, etc.

The methods described in the previous embodiments can further comprise a PEB step following the second exposure step. The preferred range of the PEB temperature is from about 70° C. to about 120° C., more preferably from about 90° C. to about 110° C. In some instances, it is possible to avoid the PEB step since for certain chemistries, such as acetal and ketal chemistries, deprotection of the resist polymer proceeds at room temperature.

The relief image pattern in the barrier layer and photoresist layer in the previous embodiments can be further transferred to the substrate by removing portions of the substrate not covered by the patterned photoresist layer. Typically, portions of the substrate are removed by reactive ion etching or some other technique known to one skilled in the art.

The invention is further described by the examples below. The invention is not limited to the specific details of the examples.

EXAMPLE 1

Synthesis of Methoxycyclohexene Protected Copolymer of 4-hydroxystyrene and 2-{[5-(1',1',1'-trifluoro-2'-trifluoromethyl-2'-hydroxy)propyl]-norbornyl]}methacrylate (PVPNBHFA-MOCH)

To a round bottom flask equipped with condenser, thermometer, an argon (Ar) inlet and a magnetic stirrer bar, the following were added: 4-acetoxystyrene monomer (10.8 g, 0.03 mole), 2-{[5-(1',1',1'-trifluoro-2'-trifluoromethyl-2'-hydroxy)propyl]-norbornyl]}methacrylate monomer (3.24 g, 0.02 mole), 2,2'-azobis(2-methylpropionitrile) (AIBN, 0.492 g, 6% of total moles of monomers), and ~55 g of tetrahydrofuran (THF). The reaction mixture was stirred at room temperature and bubbled with Ar flow for 45 minutes before it was heated. The reaction was carried out overnight at 70° C. under an inert argon atmosphere. The reaction solution was then cooled to room temperature and ~22 g of THF was blown away by a high flow of nitrogen bubbling into the flask. To the remaining reaction solution, 25 g of methanol and 7 g of concentrated $NH_4OH$ were added and the reaction was carried out at 65° C. overnight. The solution was then cooled to room temperature and added dropwise into a mixture of water (1000 ml) The precipitated polymer was separated, rinsed with water (2×300 ml) and dried in a vacuum oven at 65° C. for a short time. The polymer was re-dissolved in acetone and re-precipitated in a mixture of water (1000 ml) and glacial acetic acid (30 ml). The solid was filtered with a frit funnel, washed with water (2×300 ml) and dried in a vacuum oven at 65° C. for 24 hours. The final weight of the polymer was 12.2 g.

A 3 wt % polymer solution was prepared by dissolving 300 mg of the above obtained polymer in 10 g of PGMEA. The solution was spin-coated onto a one inch silicon wafer and baked at 100° C. for 60 s. The n and k values were measured with VB-250 VASE Ellipsometer manufactured by J.A. Woollam Co. Inc. The polymer has an n value of 1.601 and a k value of 0.269.

5 g of the above obtained polymer was dissolved with 25 g of PGMEA solution in a round bottom flask, around 11 g of the PGMEA solvent was then removed with a high nitrogen flow. The polymer solution was added with approximately 30 mg of oxalic acid. After the acid was dissolved, 6 g (excess) of 1-methoxycyclohexene was added to the solution, and the reaction was carried out at room temperature with stirring overnight. The reaction was then quenched with 4.5 g of basic active aluminum oxide. The quenched solution was filtered through 0.2 µm filter into a 120 ml glass bottle. Approximately 80 g of hexane was added to the solution, and the glass bottle with its cap tightly closed was shaken vigorously to form a coagulated polymer on the bottom of the bottle. The solvents were decanted. This coagulated polymer was washed with hexane using the same procedure three more times. The solid was then dried in a vacuum oven at 45° C. for 24 hours.

EXAMPLE 2

Formulation of Grey Resist (IML-8)

A grey resist formulation was obtained by mixing PVPNBHFA-MOCH (from EXAMPLE 1) with 0.46 wt % (relative to the polymer) proton sponge and 5.6 wt % triphenylsulfonium perfluorobutanesulfonate (TPS PFBUS) and 200-1000 ppm of FLUORAD™, FC-430 surfactant (available from 3M Company), in 4-methyl-2-pentanol. The total solid weight content in the solution was about 3%.

EXAMPLE 3

Synthesis of 2-benzyloxy-1-propene Protected Terpolymer of 2-hydroxyethyl methacrylate, 1,1,1-trifluoro-2-trifluoromethyl-2-hydroxy-4-pentyl methacrylate and 2-trifluoromethanesulfonylaminoethyl methacrylate (HEMA-IPHFA-STAR-BOP)

To a round bottom flask equipped with condenser, thermometer, an argon inlet and a magnetic stirrer bar, the following were added: 2-hydroxyethyl methacrylate monomer (2.928 g, 0.0225 mole), 1,1,1-trifluoro-2-trifluoromethyl-2-hydroxy-4-pentyl methacrylate monomer (5.88 g, 0.02 mole), 2-trifluoromethanesulfonylaminoethyl methacrylate monomer (1.958 g, 0.0075 mole), AIBN (0.41 g, 5% of total moles of monomers), and 50 g of THF. The reaction mixture was stirred at room temperature and bubbled with Ar flow for 45 minutes before it was heated. The reaction was carried out overnight at 70° C. under an inert argon atmosphere. Then the reaction solution was cooled to room temperature and precipitated in hexane. The solid was collected and dried in vacuum oven at 60° C. overnight.

3 g of the above obtained polymer was dissolved with 17 g of PGMEA solution in a round bottom flask. The polymer solution was added with approximately 20 mg of oxalic acid. After the acid was dissolved, 1.07 g of 2-benzyloxy-1-propene was added to the solution, and the reaction was carried out at room temperature with stirring overnight. The reaction was then quenched with 3.5 g of basic active aluminum oxide. The quenched solution was filtered through 0.2 µm filter into a 120 ml glass bottle. Approximately 80 g of hexane was added to the solution, and the glass bottle with its cap tightly closed was shaken vigorously to form a coagulated polymer on the bottom of the bottle. The solvents were decanted. This coagulated polymer was washed with hexane using the same procedure three more times. The solid was then dried in a vacuum oven at ~45° C. for 24 hours.

EXAMPLE 4

Formulation of a Bleachable Layer (TBL-7)

A bleachable layer formulation (TBL-7) was obtained by mixing HEMA-IPHFA-STAR-BOP (from EXAMPLE 3) with 0.46 wt. % (relative to the polymer) proton sponge and 5.6 wt. % triphenylsulfonium perfluorobutanesulfonate (TPS PFBUS) and 200-1000 ppm of FLUORAD™, FC-430 surfactant (available from 3M Company), in 4-methyl-2-pentanol. The total solid weight content in the solution was about 3 %.

EXAMPLE 5

Bleaching Test of TBL-7

The TBL-7 solution (from EXAMPLE 4) was spin-coated onto a 5 inch silicon wafer and baked at 100° C. for 60 s; then n and k values were measured with VB-250 VASE Ellipsometer manufactured by J.A. Woollam Co. Inc. An n value of 1.655 and a k value of 0.127 were obtained on the coated TBL-7 film. The TBL-7 coated wafer was then flood exposed with broad band UV light. After exposure the wafer was baked at 100° C. for 60 s, then the n and k values were measured with the ellipsometer again. An n value of 1.590 and a k value of 0.0266 were obtained. The k value of TBL-7 was reduced by 79% after exposure and bake.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method for forming a relief image on a substrate, said method comprising:
   (A) providing a coating of a photoresist layer over said substrate;
   (B) providing a coating of a barrier layer over said photoresist layer;
   (C) exposing said barrier layer to a first radiation through a first patterned mask;
   (D) baking said substrate after step (C) to form a bleached portion in said barrier layer, wherein said bleached portion of said barrier layer has substantially lower absorption than an unbleached portion of said barrier layer at an first imaging wavelength of said first radiation;
   (E) exposing at least a portion of said bleached portion of said barrier layer and said photoresist layer to a second radiation having an second imaging wavelength same as said first radiation through a second patterned mask to form a latent image, wherein said second patterned mask comprises a pattern prone to form side lobes in said photoresist layer layer, and said second patterned mask and said first patterned mask are the same mask; and
   (F) contacting said substrate after step (E) with an aqueous base solution, whereby at least a portion of said barrier layer and a portion of said photoresist are removed to form a patterned structure in said photoresist layer.

2. The method of claim 1, wherein said substrate is baked at a temperature from about 70° C. to about 120° C. in step (D).

3. The method of claim 1, wherein said barrier layer has an absorption parameter (k) greater than the k parameter of said photoresist at said imaging wavelength of said first radiation.

4. The method of claim 1, wherein said barrier layer has k parameter in the range from about 0.05 to about 0.8 at said imaging wavelength of said first radiation.

5. The method of claim 1, wherein said barrier layer has a thickness less than the thickness of said photoresist.

6. The method of claim 1, wherein said pattern prone to form side lobes in said photoresist comprises a contact hole pattern.

7. The method of claim 1, wherein said imaging wavelength of said first radiation is about 193 nm.

8. The method of claim 1, wherein the absorption parameter (k) of said bleached portion of said barrier layer is more than 20% lower than the k parameter of said unbleached portion of said barrier layer at said imaging wavelength of said first radiation.

9. The method of claim 1, wherein said first and said second aqueous base solutions comprise a tetramethylammonium hydroxide (TMAH) solution.

10. The method of claim 1, further comprising:
   etching or ion implanting portions of said substrate not covered by said photoresist layer after step (E), thereby transferring said patterned structure into said substrate.

* * * * *